US008645781B2

(12) United States Patent
Lin

(10) Patent No.: US 8,645,781 B2
(45) Date of Patent: Feb. 4, 2014

(54) TMDS RECEIVER SYSTEM AND BIST METHOD THEREOF

(75) Inventor: Chia-Hsin Lin, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 242 days.

(21) Appl. No.: 13/090,260

(22) Filed: Apr. 20, 2011

(65) Prior Publication Data

US 2012/0213262 A1 Aug. 23, 2012

(30) Foreign Application Priority Data

Feb. 23, 2011 (TW) ............................ 100106046 A

(51) Int. Cl.
*G01R 31/28* (2006.01)

(52) U.S. Cl.
USPC .......................................................... 714/742

(58) Field of Classification Search
None
See application file for complete search history.

(56) References Cited

U.S. PATENT DOCUMENTS 6,914,637 B1 * 7/2005 Wolf et al. .................... 348/473
7,068,686 B2 * 6/2006 Kobayashi .................... 370/522
7,088,398 B1 * 8/2006 Wolf et al. ................. 348/423.1
7,088,741 B2 * 8/2006 Kobayashi .................... 370/522
7,412,053 B1 * 8/2008 Lyle ................................. 380/2
7,797,536 B1 * 9/2010 Lyle .............................. 713/168
2001/0034866 A1 * 10/2001 Barry et al. ................... 714/734
2003/0177423 A1 * 9/2003 Komatsu et al. .............. 714/700
2008/0114562 A1 * 5/2008 Sul et al. ....................... 702/122
2010/0235135 A1 * 9/2010 Conner ......................... 702/119

FOREIGN PATENT DOCUMENTS

CN 1592387 A 3/2005
JP 2008-122399 A 5/2008

* cited by examiner

*Primary Examiner* — Albert Decady
*Assistant Examiner* — Enamul M Kabir
(74) *Attorney, Agent, or Firm* — Jianq Chyun IP Office

(57) ABSTRACT

A transition minimized differential signaling (TMDS) receiver system including a clock channel, a plurality of data channels, a TMDS decoding unit, and a self-test unit is provided. The clock channel receives, processes and outputs a clock signal. Each data channel receives, processes and outputs a corresponding data signal according to the clock signal. The TMDS decoding unit receives and decodes the processed data signals. The self-test unit receives the clock signal and an external parallel signal, and accordingly, generates a test signal for performing the BIST on the data channels and the TMDS decoding unit. A BIST method adapted for the TMDS receiver system is also provided.

7 Claims, 3 Drawing Sheets

TMDS RECEIVER SYSTEM AND BIST METHOD THEREOF

CROSS-REFERENCE TO RELATED APPLICATION

This application claims the priority benefit of Taiwan application serial no. 100106046, filed on Feb. 23, 2011. The entirety of the above-mentioned patent application is hereby incorporated by reference herein and made a part of this specification.

BACKGROUND OF THE INVENTION

1. Field of the Invention

The invention relates to a receiver system and a test method thereof, and more particularly, to a transition minimized differential signaling (TMDS) receiver system and a built-in-self-test (BIST) method thereof.

2. Description of Related Art

TMDS is a high speed data transmission technology that can be used in image transmission interfaces such as digital visual interface (DVI) and high-definition multimedia interface (HDMI). In general, a TMDS receiver system includes four channels, three of which are data channels for receiving YUV or RGB image signals, respectively, and the other of which is a clock channel for receiving a clock signal. Each of the channels supports up to 1.65 Gbps data transmission rate.

In the TMDS receiver system, a built-in test circuit is usually used to replace the original data channel and generate a signal to achieve the BIST. This method requires the additional test circuits disposed in the system chip, which increases the chip cost. In addition, an ordinary TMDS receiver system usually has three data channels which need more test circuits. This also increases the chip area.

SUMMARY OF THE INVENTION

Accordingly, the invention is directed to a TMDS receiver system which utilizes a clock signal generated by the clock channel to achieve the BIST, making the system circuit more advantageous in area.

The invention is also directed to a BIST method which utilizes a clock signal generated by the clock channel to achieve the BIST.

The invention provides a TMDS receiver system including a clock channel, a plurality of data channels, a TMDS decoding unit, and a self-test unit. The clock channel receives, processes and outputs a clock signal. The data channels receive, process and output corresponding data signals according to the clock signal. The TMDS decoding unit receives and decodes the processed data signals. The self-test unit receives the clock signal and an external parallel signal, and accordingly, generates a test signal to perform a BIST on the data channels and the TMDS decoding unit.

According to one embodiment, the self-test unit includes a frequency synthesizer and a logic operation unit. The frequency synthesizer receives the clock signal, and accordingly generates a multiple frequency signal. The frequency of the multiple frequency signal is more than one time of the frequency of the clock signal. The logic operation unit receives and performs a logic operation on the multiple frequency signal and the external parallel signal to generate the test signal.

According to one embodiment, the logic operation unit performs at least one of OR, AND, XOR and XNOR operations on the multiple frequency signal and the external parallel signal to generate the test signal.

According to one embodiment, the external parallel signal is generated by a signal generator external to the TMDS receiver system.

According to one embodiment, each of the data channels includes an equalizer and a data recovery unit, and the self-test unit performs the BIST on the data recovery units of the data channels.

According to one embodiment, the clock channel includes a phase lock loop. The phase lock loop is adapted to receive, synchronize, and output the clock signal to the self-test unit and the data channels.

The invention also provides a BIST method adapted for a TMDS receiver system. In the BIST method, an external parallel signal is received. A test signal is generated according to a clock signal of the TMDS receiver system and the external parallel signal. The BIST is performed on the TMDS receiver system by using the test signal.

According to one embodiment, the step of generating the test signal includes following steps. A multiple frequency signal is generated according to the clock signal, wherein the frequency of the multiple frequency signal is more than one time of the frequency of the clock signal. A logic operation is performed on the multiple frequency signal and the external parallel signal to generate the test signal.

According to one embodiment, the logic operation includes at least one of OR, AND, XOR and XNOR operations.

In view of the foregoing, in the exemplary embodiment of the invention, the clock signal provided by the clock channel is used as the signal source for the BIST in the TMDS receiver system. This clock signal is used in combination with the frequency synthesizer and an external parallel signal to perform the BIST, thereby making the system circuit more advantageous in area.

BRIEF DESCRIPTION OF THE DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION OF THE EMBODIMENTS

Figure 1:
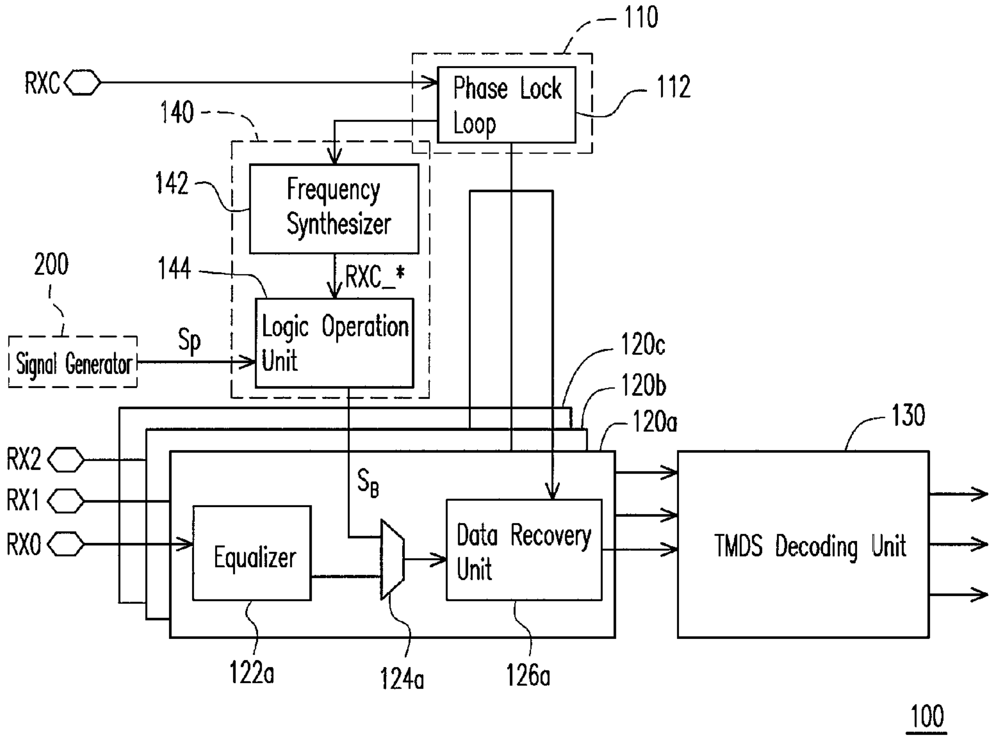
FIG. 1 is a functional block diagram of a TMDS receiver system according to one embodiment of the invention.

FIG. 1 is a functional block diagram of a TMDS receiver system according to one embodiment of the invention. Referring to FIG. 1, the TMDS receiver system 10 of the present embodiment includes a clock channel 110, a plurality of data channels 120*a*, 120*b*, and 120*c*, a TMDS decoding unit 130, and a self-test unit 140.

In the present embodiment, the clock channel 110 includes a phase lock loop 112. The phase lock loop 112 receives a clock signal RXC, and after synchronization, outputs the clock signal RXC to the self-test unit 140 and the data channels 120*a*, 120*b*, and 120*c*.

The data channels 120*a*, 120*b*, and 120*c* receive, process and output corresponding data signals RX0, RX1, and RX2 according to the clock signal RXC. In this regard, the data channels 120*a*, 120*b*, and 120*c*, for example, recover and fix the received data signals RX0, RX1, and RX2. Therefore, the data channels 120*a*, 120*b*, and 120*c* of the present embodiment respectively include an equalizer, a selector, and a data recovery unit. In the present embodiment, each of the data channels has the same or similar features. Therefore, only the equalizer 122*a*, selector 124*a* and data recovery unit 126*a* of the data channel 120*a* is illustrated in FIG. 1. Circuits of the data channels 120*b* and 120*c* can be configured in a similar manner.

Taking the data signal RX0 as an example, before the TMDS decoding unit 130 decodes the data signal RX0, the equalizer 122*a* equalizes the data signal RX0 received by the data channel 120*a*. The data recovery unit 126*a* then recover s and fixes the data signal RX0 to provide a recovered and fixed data signal RX0 to the TMDS decoding unit 130. The TMDS decoding unit 130 then decodes the data signal after receiving the data signal RX0, RX1, and RX2.

On the other hand, in the present embodiment, the self-test unit 140 receives a clock signal RXC from the phase lock loop 112 and an external parallel signal Sp, and accordingly, generates a test signal $S_B$ to perform the BIST on the data recovery units of each data channel and the TMDS decoding unit 130.

Figure 2:
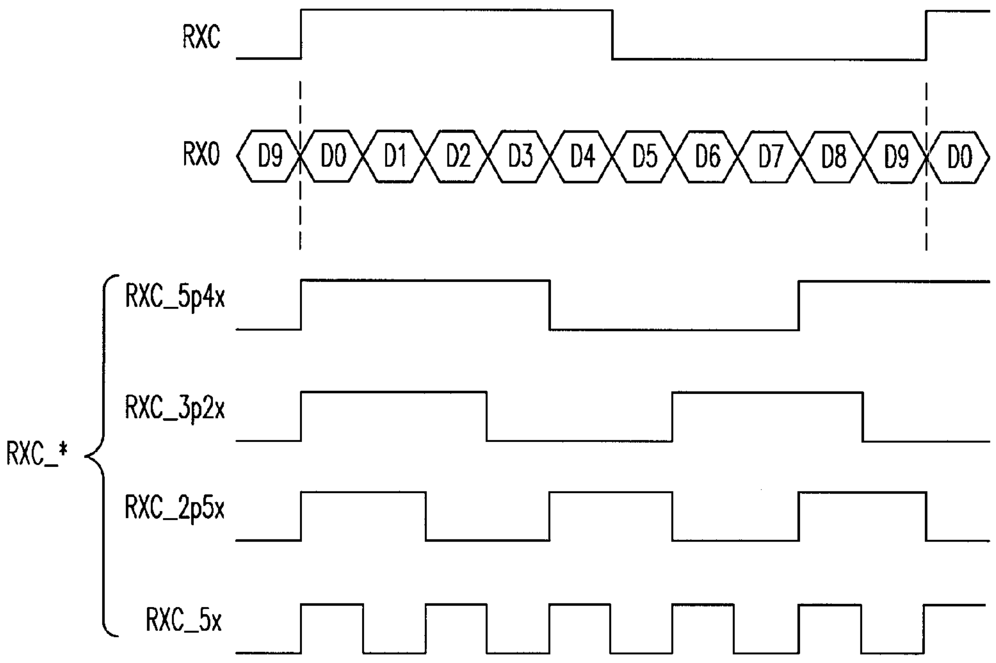
FIG. 2 illustrates a signal waveform diagram of the clock signal, the data signal and the multiple frequency signal according to one embodiment of the invention.

Specifically, the self-test unit 140 includes a frequency synthesizer 142 and a logic operation unit 144. The frequency synthesizer 142 receives the clock signal RXC, and accordingly, generates a multiple frequency signal RCX_*. The frequency of the multiple frequency signal RCX_* is more than one time of the frequency of the clock signal RXC. FIG. 2 illustrates a signal waveform diagram of the clock signal, the data signal and the multiple frequency signal according to one embodiment of the invention. In the present embodiment, the frequency of the multiple frequency signals RCX_*, indicated by RCX_5*p*4*x*, RCX_3*p*2*x*, RCX_2*p*5*x*, and RCX_5*x* in FIG. 2, are, for example, 1.25, 1.5, 2.5, and 5 times of the frequency of the clock signal RXC. However, these multiple frequency signals are illustrative rather than limiting. In other words, by using the frequency synthesizer 142, the TMDS receiver system 100 of the present embodiment can output signals that are 1.25, 1.5, 2.5, and 5 times the clock signal RXC in frequency.

After receiving the multiple frequency signal RCX_* and the external parallel signal Sp, the logic operation unit 144 performs a logic operation on the multiple frequency signal RCX_* and the external parallel signal Sp to generate a test signal $S_B$. In this regard, the external parallel signal Sp is, for example, generated by a signal generator 200 external to the TMDS receiver system 100. However, this is for the purposes of illustration only and should not be regarded as limiting. Rather, the external parallel signal Sp can be outputted by an external register or alternatively outputted by the logic operation unit 144. The signal generator 200 of the present embodiment is, for example, a pattern generator controlling a 10-bit signal from outside, and then, the pattern generator transforms various random parallel pattern data into serial patterns and outputs these serial patterns. In addition, in the present embodiment, the logic operation performed by the logic operation unit 144 on the multiple frequency signal RCX_* and the external parallel signal Sp for generating the test signal $S_B$ includes at least one of OR, AND, XOR and XNOR operations.

Figure 3:
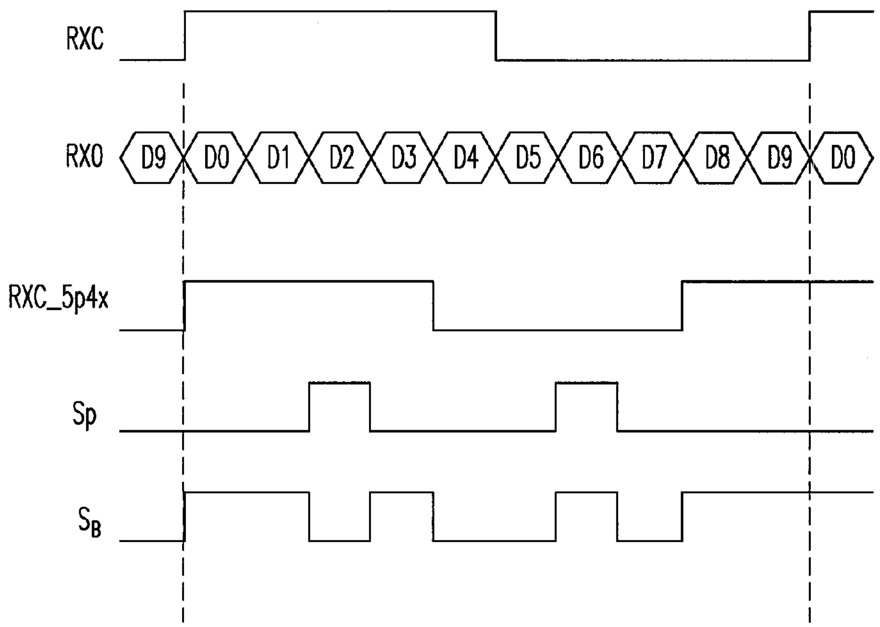
FIG. 3 illustrates a signal waveform diagram of the clock signal, the data signal, the multiple frequency signal, the external parallel signal and the test signal according to one embodiment of the invention.

More specifically, FIG. 3 illustrates a signal waveform diagram of the clock signal, the data signal, the multiple frequency signal, the external parallel signal and the test signal according to one embodiment of the invention. Taking the multiple frequency signal RCX_5*p*4*x* as an example, the frequency synthesizer 142 changes the frequency of the clock signal RXC and up-converts the clock signal RXC to obtain the multiple frequency signal RCX_5*p*4*x*. The logic operation unit 144 then performs XNOR operation on the multiple frequency signal RCX_5*p*4*x* and the external parallel signal $S_P$ to generate the test signal $S_B$, as shown in FIG. 3. In other words, the TMDS receiver system 100 of the present embodiment changes the clock signal frequency to up-convert the clock signal, so that the up-converted signal is used as a signal source for self-test. In another embodiment, the TMDS receiver system may also down-convert the clock signal or change the working period of the clock signal, so that the down-converted or changed signal is used as the signal source for self-test. Thus, in the present embodiment, an operation may be performed on any combination of the output of the signal generator 200 and the output of the frequency synthesizer 142 without generating signal glitch.

Figure 4:
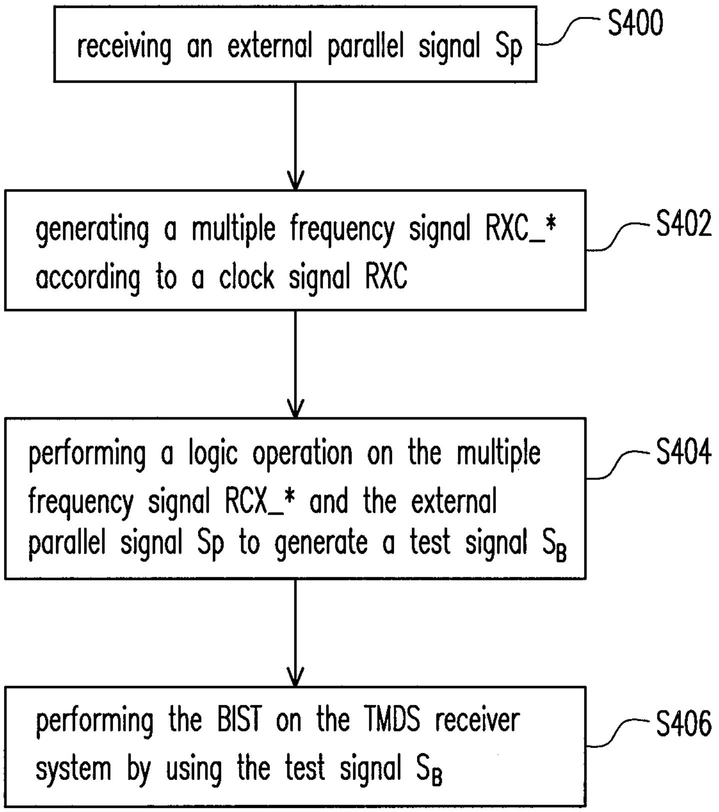
FIG. 4 is a flow chart of a BIST method according to one embodiment of the invention.

FIG. 4 is a flow chart of a BIST method according to one embodiment of the invention. Referring to FIGS. 1 to 4, the BIST method of the present embodiment is, for example, adapted for use in the TMDS receiver system 100 of FIG. 1 and includes the following steps.

At step S400, an external parallel signal $S_P$ is first received by the logic operation unit 144. At step S402, a multiple frequency signal RXC_* is generated by the frequency synthesizer 142 according to a clock signal RXC provided by the phase lock loop 112. At step S404, the logic operation unit 144 performs a logic operation on the multiple frequency signal RXC_* and the external parallel signal $S_P$ to generate a test signal $S_B$. At step S406, a BIST is performed on the TMDS receiver system by using the test signal $S_B$. It is noted, however, that the sequence of step S400 and S402 is illustrative rather than limiting.

Besides, the BIST method described in this embodiment of the invention is sufficiently taught, suggested, and embodied in the embodiments illustrated in FIGS. 1 to 3, and therefore no further description is provided herein.

In summary, in the exemplary embodiment of the invention, the clock signal provided by the clock channel is used as the signal source for the BIST in the TMDS receiver system. This clock signal is used in combination with the frequency synthesizer and an external parallel signal to perform the BIST. Thus, no additional test circuit is required for the data channels, thereby making the system circuit more advantageous in area.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims and their equivalents.

What is claimed is:

1. A transitional minimized differential signaling (TMDS) receiver system comprising:

a clock channel adapted to receive, process and output a clock signal;

a plurality of data channels adapted to receive, process and output corresponding data signals according to the clock signal;

a TMDS decoding unit adapted to receive and decode the processed data signals; and a self-test unit, coupled between the clock channel and each of the data channels, wherein the self-test unit is adapted to receive the clock signal and an external parallel signal, and accordingly, generate a test signal to perform a built-in-self-test (BIST) on the data channels and the TMDS decoding unit, wherein the self-test unit comprises:

a frequency synthesizer adapted to receive the clock signal, and accordingly generate a multiple frequency signal, wherein the frequency of the multiple frequency signal is more than one time of the frequency of the clock signal; and a logic operation unit adapted to receive and perform a logic operation on the multiple frequency signal and the external parallel signal to generate the test signal, wherein each of the data channels comprises a selector for selecting the test signal or the corresponding data signal to perform the BIST.

2. The TMDS receiver system according to claim 1, wherein the logic operation unit performs at least one of OR, AND, XOR and XNOR operations on the multiple frequency signal and the external parallel signal to generate the test signal.

3. The TMDS receiver system according to claim 1, wherein the external parallel signal is generated by a signal generator external to the TMDS receiver system.

4. The TMDS receiver system according to claim 1, wherein each of the data channels comprises an equalizer and a data recovery unit, and the self-test unit performs the BIST on the data recovery units of the data channels.

5. The TMDS receiver system according to claim 1, wherein the clock channel comprises a phase lock loop, and the phase lock loop is adapted to receive, synchronize, and output the clock signal to the self-test unit and the data channels.

6. A built-in-self-test (BIST) method, adapted for a transition minimized differential signaling (TMDS) receiver system, the BIST method comprises:

receiving an external parallel signal;

generating a test signal according to a clock signal of the TMDS receiver system and the external parallel signal;

performing the BIST on the TMDS receiver system by using the test signal, wherein the step of generating the test signal comprises:

generating a multiple frequency signal according to the clock signal, wherein the frequency of the multiple frequency signal is more than one time of the frequency of the clock signal; and performing a logic operation on the multiple frequency signal and the external parallel signal to generate the test signal, wherein the step of performing the BIST on the TMDS receiver system by using the test signal comprises:

selecting the test signal or a data signal to perform the perform the BIST.

7. The BIST method according to claim 6, wherein the logic operation comprises at least one of OR, AND, XOR and XNOR operations.

* * * * *